United States Patent [19]

Ishikawa et al.

[11] Patent Number: 5,101,315

[45] Date of Patent: Mar. 31, 1992

[54] DRIVE CONTROL APPARATUS FOR ELECTRIC ACTUATOR

[75] Inventors: Takumi Ishikawa; Nobuyasu Suzumura; Masahiko Noba, all of Toyota; Toshikazu Koide, Toyokawa, all of Japan

[73] Assignee: Aisin Seiki K. K., Aichi, Japan

[21] Appl. No.: 594,482

[22] Filed: Oct. 9, 1990

[30] Foreign Application Priority Data

Oct. 9, 1989 [JP] Japan ................................. 1-263273

[51] Int. Cl.⁵ .............................................. H02H 7/08
[52] U.S. Cl. ....................................... 361/24; 361/59; 361/103; 364/483; 364/557
[58] Field of Search ....................... 361/24, 25, 30, 18, 361/59, 103; 364/483, 557; 323/907

[56] References Cited

U.S. PATENT DOCUMENTS

4,413,325  11/1983  Elfner et al. .......................... 361/25

Primary Examiner—A. D. Pellinen
Assistant Examiner—Christopher Schultz
Attorney, Agent, or Firm—Sughrue, Mion, Zinn, Macpeak & Seas

[57] ABSTRACT

In a drive control apparatus for an electric actuator to be activated under control of a changeover switch, the drive control apparatus including a power transistor arranged to supply therethrough the power to the electric actuator from an electric power source in response to operation of the changeover switch, a presumptive temperature of the power transistor is previously memorized and renewed in consideration with an increment of temperature change caused by consumption of the power when the electric actuator has been activated. The presumptive temperature is further renewed in consideration with a decrement of temperature change caused by lapse of time after the electric actuator has been deactivated. The power supply to the electric actuator is permitted only when the presumptive temperature is lower than a predetermined value. When the presumptive temperature becomes higher than the predetermined value, the power supply to the electric actuator is prohibited.

2 Claims, 5 Drawing Sheets

DRIVE CONTROL APPARATUS FOR ELECTRIC ACTUATOR

BACKGROUND OF THE INVENTION

1. Field of the Invention

The present invention relates to a drive control apparatus for an electric actuator such as an electric motor assembled within a wheel hub clutch mechanism to be frequently activated under control of a manual changeover switch.

2. Description of the Prior Art

In Japanese Utility Model Early Publication No. 63-188231, there is disclosed a wheel hub clutch mechanism provided therein with a reversible electric motor which is activated under control of a manual changeover switch to engage the clutch mechanism in its forward rotation and to disengage the clutch mechanism in its reverse rotation. In a drive control apparatus for the electric motor, power transistors are provided to supply therethrough the power to the electric motor from an electric power source. If the electric motor is frequently activated under control of the changeover switch, the power transistors are heated by the power applied thereto. As a result, the power transistors will be damaged if overheated.

SUMMARY OF THE INVENTION

It is, therefore, a primary object of the present invention to provide a drive control apparatus for the electric motor capable of protecting the power transistors from damage caused by overheating thereof.

According to the present invention, the primary object is attained by providing a drive control apparatus for an electric actuator such as an electric motor to be activated under control of a changeover switch, which drive control apparatus includes a power transistor arranged to supply therethrough the power to the electric actuator from an electric power source in response to operation of the changeover switch, wherein the drive control apparatus comprises memory means for memorizing a presumptive temperature of the power transistor, first renewal means for renewing the presumptive temperature in consideration with an increment of temperature change caused by consumption of the power in accordance with a lapse of time when the electric actuator has been activated, second renewal means for renewing the presumptive temperature in consideration with a decrement of temperature change caused by a lapse of time after the electric actuator has been deactivated, and means for permitting supply of the power to the electric actuator through the power transistor when the presumptive temperature is lower than a predetermined value and for prohibiting supply of the power to the electric actuator through the power transistor when the presumptive temperature becomes higher than the predetermined value.

BRIEF DESCRIPTION OF THE DRAWINGS

Other objects, features and advantages of the present invention will be more readily appreciated from the following detailed description of a preferred embodiment thereof when taken together with the accompanying drawings in which.

DESCRIPTION OF THE PREFERRED EMBODIMENT

Figure 1:
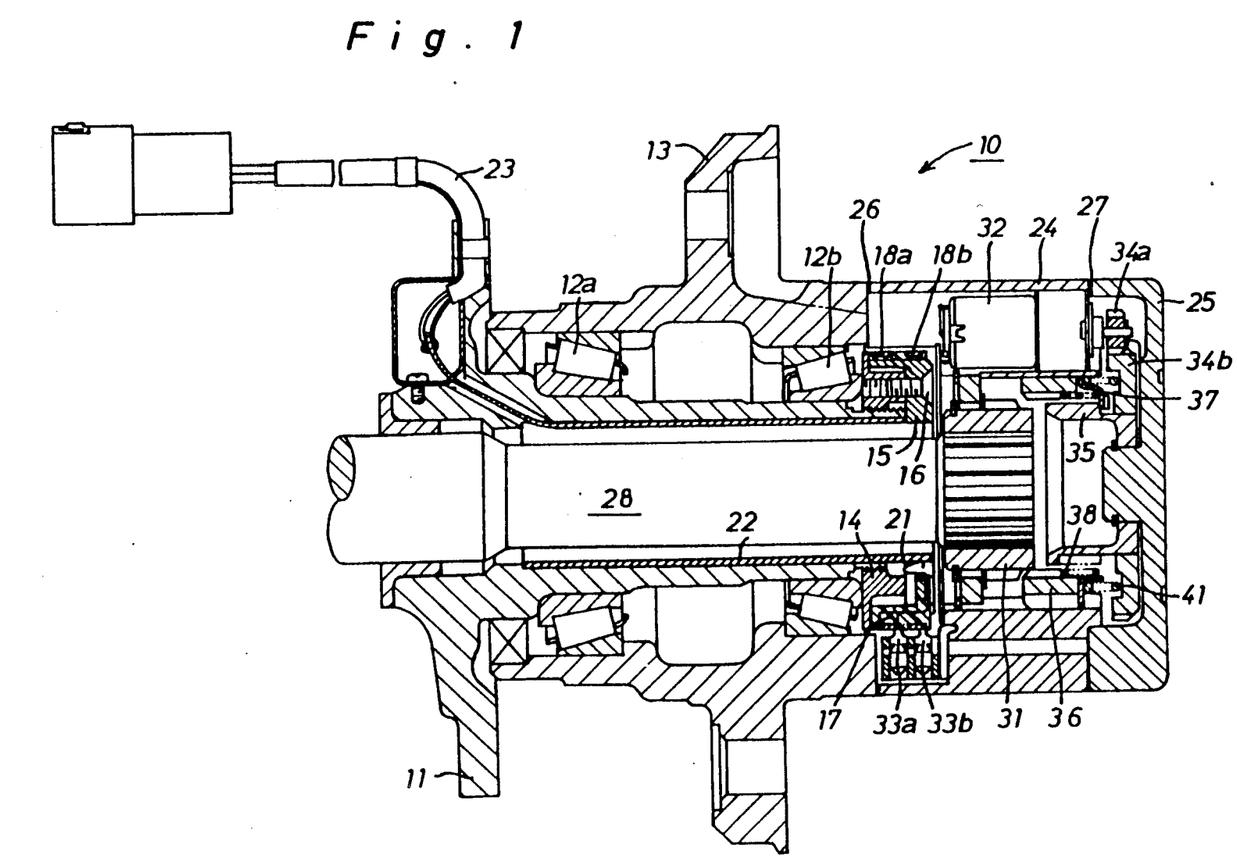
FIG. 1 is a sectional view of a wheel hub clutch mechanism adapted for use in a four-wheel drive vehicle.

In FIG. 1 of the drawings, there is illustrated a wheel hub clutch mechanism 10 adapted for use in a four-wheel drive vehicle. The wheel hub clutch mechanism 10 is mounted to a wheel hub 13 which is rotatably supported on a stationary axle tube 11 through a pair of axially spaced bearings 12a, 12b. The bearing 12b is positioned in place on the outer end of axle tube 11 by means of a lock nut 14. An annular holder 15 is engaged with the outer end of axle tube 11 and fixed to the lock nut 14 by means of bolts 16. A pair of axially spaced slip rings 18a, 18b are coupled over the annular holder 15 through an annular insulation member 17 and connected to a lead wire 23 through a spring contact 21 and a tubular flexible printed-circuit board 22.

The wheel hub clutch mechanism 10 includes a cylindrical body 24 coupled with the outer end of wheel hub 13 through an annular gasket 26 and fastened in place by means of circumferentially spaced bolts (not shown) threaded therethrough into wheel hub 13. The cylindrical body 24 is closed by a cover member 25 secured thereto through an annular gasket 27 and contains therein an inner clutch member 31 which is mounted on the outer end of a drive axle 28 for rotation therewith. Assembled within a peripheral wall of cylindrical body 24 is an electric motor 32 which is electrically connected to the slip rings 18a, 18b through brushes 33a, 33b. The electric motor 32 is in the form of a reversible direct current motor drivingly connected to a cam rotor 35 through reduction gears 34a, 34b to rotate the cam rotor 35 in a forward or reverse direction. The cam rotor 35 is engaged with an annular cam follower 37 which is maintained in engagement with an outer clutch member 36 under load of a compression coil spring 41 and connected with the outer clutch member 36 by means of a tension coil spring 38. The outer clutch member 36 is axially slidably coupled at its externally splined portion with an internally splined portion of cylindrical body 24 to be brought into engagement with the inner clutch member 31.

When the electric motor 32 is activated to rotate the cam rotor 35 in the forward direction, the cam follower 37 cooperates with the cam rotor 35 to bring the outer clutch member 36 into engagement with the inner clutch member 31 for establishing a drive connection between the drive axle 28 and the wheel hub 13. When the electric motor 32 is activated to rotate the cam rotor 35 in the reverse direction, the cam follower 37 cooperates with the cam rotor 35 to disengage the outer clutch member 36 from the inner clutch member 31 for permitting free rotation of the wheel hub 13 about the axle tube 11.

Figure 2:
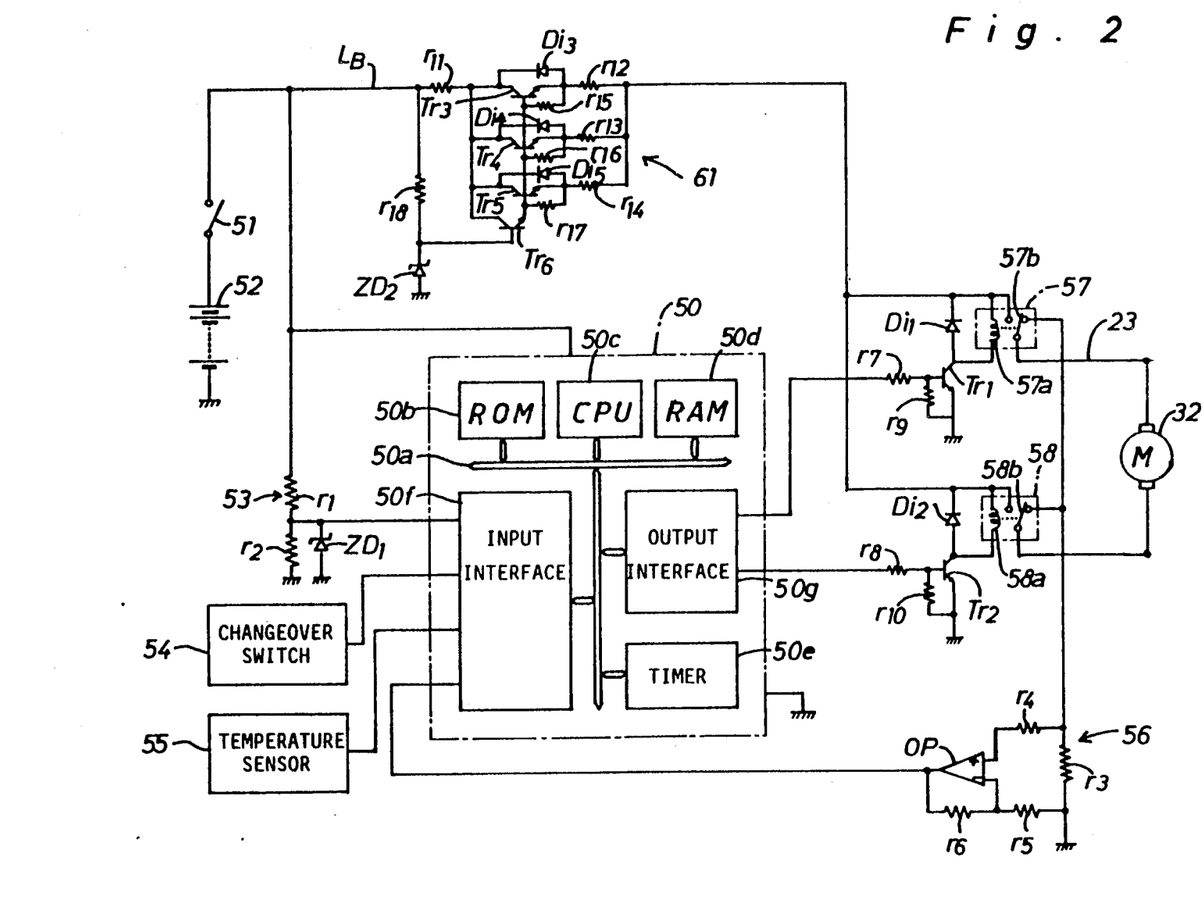
FIG. 2 is a diagram of a drive control apparatus for an electric motor assembled with the clutch mechanism.

In FIG. 2 there is illustrated a drive control apparatus for the electric motor 32 which includes a microcomputer 50 connected to a power source line $L_B$ and grounded. The computer 50 has a read-only memory or ROM 50b, a central processing unit or CPU 50c, a random-access memory or RAM 50d, a timer circuit 50e, an input interface 50f and an output interface 50g which are connected to a common bus line 50a. The power source line $L_B$ is connected to a vehicle battery 52 through an ignition switch 51 of the vehicle. ROM 50b is arranged to memorize main and interruption programs shown by flow charts in FIGS. 3 and 4 and to memorize tables of FIGS. 5 and 6 in which increment and decrement of temperature change are illustrated respectively in relation to a difference between a presumptive temperature Tx and an ambient temperature. The presumptive temperature Tx represents an internal temperature of power transistors $Tr_3$ to $Tr_5$ described in detail later, the ambient temperature Tc represents an ambient temperature of power transistors $Tr_3$ to $Tr_5$, and the increment and decrement of temperature change $\Delta T$ represent a change of the presumptive temperature Tx during execution of the interruption program. CPU 50c is arranged to execute the main program when the ignition switch 51 is closed and to execute the interruption program when applied with an interruption signal from the timer circuit 50e. RAM 50d is arranged to temporarily memorize variables necessary for execution of the main program. The timer circuit 50e includes an oscillator which produces an interruption signal therefrom at a predetermined time interval of, for instance, 0.5 ms.

The input interface 50f includes an input circuit, an analog to digital converter and a memory circuit. The input interface 50f is connected to a voltage detection circuit 53, a changeover switch 54, a temperature sensor 55 and a current detection circuit 56. The voltage detection circuit 53 is composed of resistors $r_1$, $r_2$ connected in series between the power source line $L_B$ and the ground and a zener diode $ZD_1$ connected in parallel with the resistor $r_2$. Thus, the input interface 50f is arranged to be applied with a battery voltage divided by resistors $r_1$ and $r_2$. The changeover switch 54 is located in a position adjacent the driver's seat to be operated by the driver. The changeover switch 54 is in the form of a normally open type switch to be maintained in an open position when the wheel hub clutch mechanism 10 is in a disengaged condition and to be closed when it is desired to engage the clutch mechanism 10. The temperature sensor 55 is located adjacent the power transistors $Tr_3$ to $Tr_5$ to detect an ambient temperature of power transistors $Tr_3$ to $Tr_5$ and apply a voltage indicative of the detected ambient temperature to the input interface 50f. The current detection circuit 56 is arranged to detect a drive current supplied to the electric motor 32 through the power transistors $Tr_3$ to $Tr_5$. The current detection circuit 56 includes a resistor $r_3$ arranged to convert the drive current into a corresponding voltage and an operational amplifier OP associated with resistors $r_4$ to $r_6$ to apply the converted voltage from resistor $r_3$ to the input interface 50f therethrough.

The output interface 50g includes a memory circuit and an output circuit. Switching transistors $Tr_1$ and $Tr_2$ are connected at their bases to the output interface 50g through resistors $r_7$, $r_8$, respectively to control rotation of the electric motor 32. The transistors $Tr_1$, $Tr_2$ are grounded at their emitters and connected further at their emitters to their bases through resistors $r_9$, $r_{10}$, respectively. The transistors $Tr_1$, $Tr_2$ are connected at each of their collectors to one end of coils 57a, 58a of relay circuits 57, 58. The relay coils 57a, 58a are connected in parallel with flywheel diodes $Di_1$, $Di_2$ and connected at their other ends to a step-down circuit 61 which is provided to step down the source voltage of battery 52 to a constant voltage suitable for activating the electric motor 32.

The step-down circuit 61 includes the power transistors $Tr_3$ to $Tr_5$ connected in parallel to one another and connected at their collectors to the power source line $L_B$ through a resistor $r_{11}$. The power transistors $Tr_3$ to $Tr_5$ are connected at their emitters to the relay circuits 57, 58 through resistors $r_{12}$ to $r_{14}$ and connected at their emitters to their collectors through diodes $Di_3$ to $Di_5$. The power transistors $Tr_3$ to $Tr_5$ are further connected at their emitters to their bases through resistors $r_{15}$ to $r_{17}$, respectively. A transistor $Tr_6$ is connected at its emitter to the bases of transistors $Tr_3$ to $Tr_5$ and at its collector to the collectors of transistors $Tr_3$ to $Tr_5$. The transistor $Tr_6$ is applied at its base with a constant voltage defined by a resistor $r_{18}$ and a zener diode $ZD_2$ connected in series between the power source line $L_B$ and the ground. The relay circuits 57, 58 include switches 57b, 58b which are switched over by energization of the relay coils 57a, 58a. During deenergization of the relay coils 57a, 58a, the switches 57b, 58b each are retained in a first position as shown in the figure to maintain the electric motor 32 in its deactivated condition. When the relay coils 57a, 58a are selectively energized, the switches 57b, 58b each are switched over to a second position to apply an output voltage of step-down circuit 61 to the electric motor 32.

Hereinafter, the operation of the electric drive control apparatus will be described in detail with reference to FIGS. 3 and 4.

INITIAL CONTROL

Figure 3:
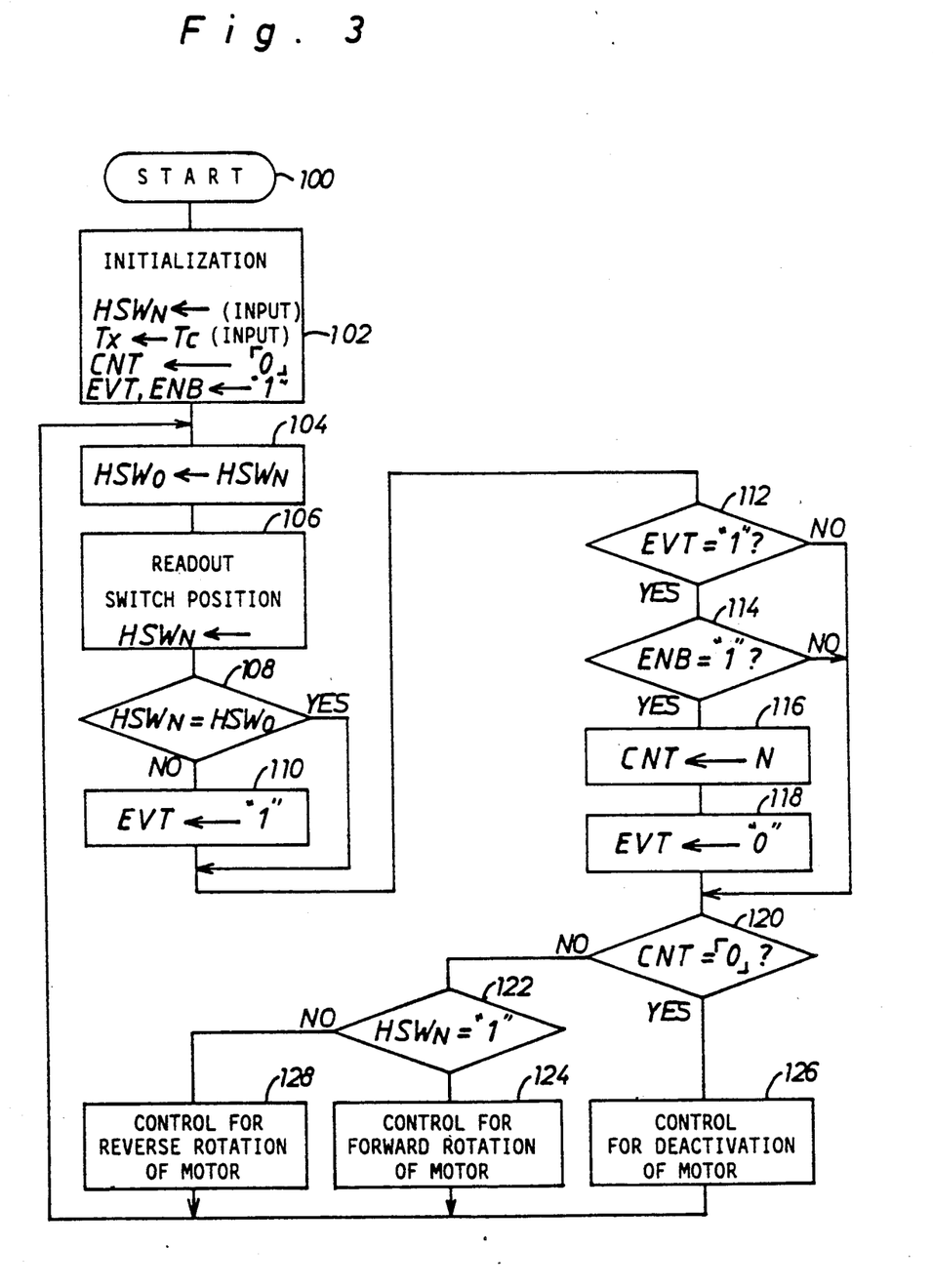
FIG. 3 is a flow chart of a main program executed by a microcomputer shown in FIG. 2.
Figure 4:
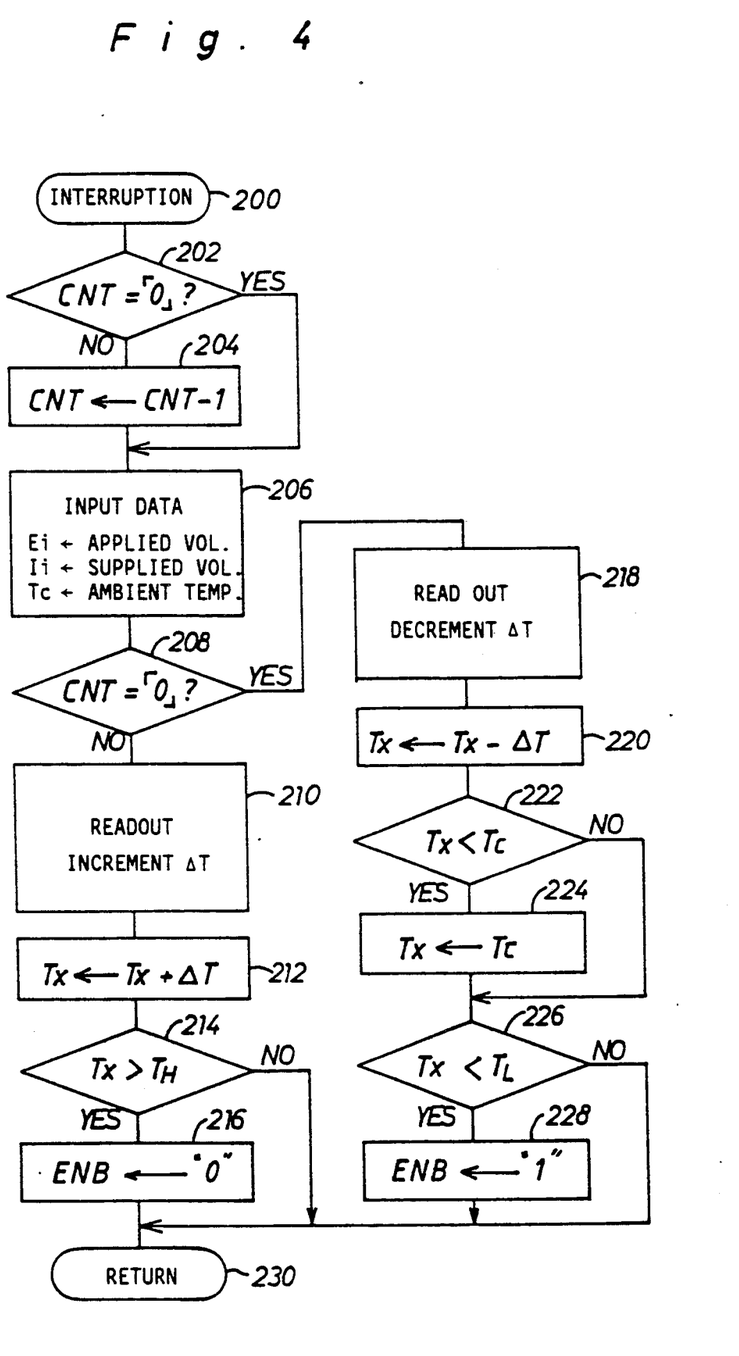
FIG. 4 is a flow chart of an interruption program executed by the computer.

Assuming that the ignition switch 51 has been closed in a condition where the wheel hub clutch mechanism 10 is in a disengaged condition, the computer 50 is applied with the source voltage from battery 52, and in turn, CPU 50c initiates execution of the main program at step 100 shown in FIG. 3. At the following step 102, CPU 50c sets a data indicative of the condition of changeover switch 54 as a new condition data $HSW_N$ and sets an ambient temperature Tc as a presumptive temperature Tx. At this step, CPU 50c further sets a count value CNT for control of power supply time as "0" and sets an event flag EVT and an enable flag ENB as "1", respectively. In this instance, the new condition data $HSW_N$ is set as "1" when the changeover switch 54 is retained in its closed position. When the changeover switch 54 is maintained in its open position, the new condition data $HSW_N$ is set as "0". The count value CNT is adapted to define an optimal activation time of the electric motor 32. At an initial stage for control of the activation time, the court value CNT is set as a positive value N to be reduced by "1" to "0" in accordance with a lapse of time. The event flag EVT is set as "1" when the changeover switch 54 is operated by the driver. The enable flag ENB is adapted to permit the power supplied to the electric motor 32 through power transistors $Tr_3$ to $Tr_5$ when it is set as "1" and to prohibit the power supply to the electric motor 32 when it is set as "0".

After processing at step 102, CPU 50c renews an old condition data $HSW_O$ with the new condition data $HSW_N$ at step 104 and reads out the position of changeover switch 54 at step 106 to set again the new condition data $HSW_N$. At the following step 108, CPU 50c determines as to whether or not the new condition data $HSW_N$ coincides with the old condition data $HSW_O$. As the changeover switch 54 is still maintained in its open position, CPU 50c determines a "Yes" answer at step 108 and causes the program to proceed to step 112 where CPU 50c determines as to whether or not the event flag EVT is "1". CPU 50c further determines at step 114 as to whether or not the enable flag ENB is "1". Since the event flag EVT and enable flag ENB each is previously set as "1" at step 102, CPU 50c determines a "Yes" answer at steps 112 and 114 and causes the program to proceed to step 116. At step 116, CPU 50c sets the count value CNT as a positive value N which is determined to represent an optimal period of power supply time necessary for engaging or disengaging the clutch mechanism 10.

After processing at step 116, CPU 50c sets the event flag EVT as "0" at step 118 and causes the program to proceed to step 120. Since the count value CNT is being set as a larger value than "0", 50c determines a "No" answer at step 120 and determines at step 122 as to whether or not the new condition data $HSW_N$ is "1". When the new condition data $HSW_N$ is "1" in a condition where the changeover switch 54 is in its closed position, CPU 50c determines a "Yes" answer at step 122 and causes the program to proceed to step 124. Thus, CPU 50c produces a control data for rotating the electric motor 32 in the forward direction and applies it to the output interface 50g. When applied with the control data from CPU 50c through the output interface 50b, the transistor Tr₁ is turned on while the transistor Tr₂ is turned off. As a result, the relay coil 57a is energized to switch over the relay switch 57b from the first position to the second position, while the relay coil 58a is maintained in its deenergized condition to retain the relay switch 58b in the first position. In turn, the electric motor 32 is supplied with a drive current flowing in a direction shown by an arrow in FIG. 2. In this instance, the electric motor 32 does not rotate if the wheel hub clutch mechanism 10 is in an engaged condition. Only when the changeover switch 54 has been closed in a condition where the clutch mechanism 10 is in a disengaged condition, the electric motor 32 is activated by the drive current to rotate in the forward direction. The forward rotation of electric motor 32 causes the cam rotor 35 to rotate in the forward direction, and in turn, the cam follower 37 cooperates with the cam rotor 35 under the load of coil spring 41 to bring the outer clutch member 36 into engagement with the inner clutch member 31.

After processing at step 124, the program returns to step 104, and in turn, the execution at steps 104 to 108, 112, 120, 122 and 124 is repeated until the count value CNT becomes "0". During such execution, the timer circuit 50e produces an interruption signal therefrom at a predetermined time interval. When applied with the interruption signal, CPU 50c ceases the execution of the main program and initiates execution of the interruption program at step 200 shown in FIG. 4. Thus, CPU 50c successively subtracts "1" from the count value CNT by processing at steps 202 and 204. When the count value CNT becomes "0", CPU 50c determines a "Yes" answer at step 120 of the main program and produces a control data for deactivating the electric motor 32 at step 126. When applied with the control data from CPU 50c through the output interface 50g, the transistor Tr₁ is turned off and maintained in its off-position while the transistor Tr₂ is maintained in its off-position. Thus, the relay coil 57a is deenergized to switch over the relay switch 57b from the second position to the first position. As a result, the power supply to the electric motor 32 is released.

If the new condition data $HSW_N$ is "0" at step 122 in a condition where the changeover switch 54 is in its open position, CPU 50c determines a "No" answer after execution at steps 104 to 120 and causes the program to step 128. Thus, CPU 50c produces a control data for rotating the electric motor 32 in the reverse direction and applies it to the output interface 50g. When applied with the control data from CPU 50c through the output interface 50g, the transistor Tr₂ is turned on while the transistor Tr₁ is maintained in its off-position. As a result, the relay coil 57a is maintained in its deenergized condition to retain the relay switch 57b in the first position, while the relay coil 58a is energized to switch over the relay switch 58b from the first position to the second position. Thus, the electric motor 32 is supplied with the drive current flowing in the reverse direction.

If the clutch mechanism 10 is in a disengaged condition during the execution described above, the electric motor 32 does not rotate. Only when applied with the reverse drive current in a condition where the clutch mechanism 10 is being engaged, the electric motor 32 starts to rotate in the reverse direction, and in turn, the cam rotor 35 rotates in the reverse direction to cooperate with the cam follower 37 thereby to disengage the outer clutch member 36 from the inner clutch member 31 against the biasing force of spring 41. After processing at step 128, the execution at steps 104 to 108, 112, 120, 122 and 128 is repeated until the count value CNT becomes "0". When the count value CNT becomes "0", CPU 50c determines a "Yes" answer at step 120 and causes the program to proceed to step 126. Thus, the power supply to electric motor 32 is released after the outer clutch member 36 has been fully disengaged from the inner clutch member 31. Subsequently, CPU 50c will repeat execution at steps 104 to 108, 112, 120 and 126.

From the above description, it will be understood that under the initial control the condition of clutch mechanism 10 coincides with the condition of changeover switch 54 immediately after the ignition switch 51 has been closed.

USUAL CONTROL

After the initial control described above, the main and interruption programs will be repeatedly executed by CPU 50c as follows. If the changeover switch 54 is not switched over during execution of the main program, the new condition data $HSW_N$ will be the same as the old condition data $HSW_O$, and the event flag EVT and count value CNT will be maintained as "0", respectively. Thus, the execution at steps 104 to 108, 112, 120 and 126 will be repeated. Assuming that the changeover switch 54 has been closed or opened, CPU 50c sets the new condition data $HSW_N$ as a different value from the old condition data $HSW_O$ at steps 104 and 106 and determines a "No" answer at step 108. In turn, CPU 50c sets the event flag EVT as "1" at step 110 and determines a "Yes" answer at step 112. At the following step 114, CPU 50c determines as to whether or not the enable flag ENB is "1". If the answer is "Yes", the program proceeds to steps 116 and 118. If the answer is "No", the program proceeds to step 120.

Figure 5:
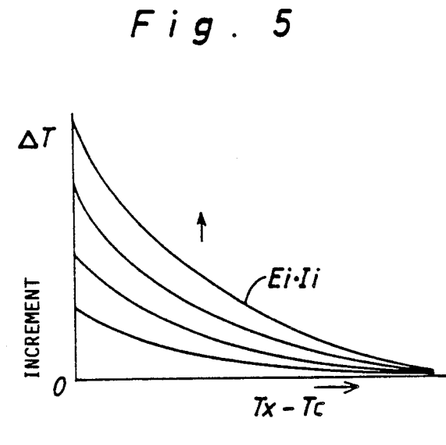
FIG. 5 is a graph illustrating an increment of temperature change in relation to a difference between a presumptive temperature of power transistors and an ambient temperature.

In this instance, the enable flag ENB will be processed during execution of the interruption program as follows. Assuming that the interruption program has proceeded to step 206 after renewal of the count value CNT at steps 202 and 204, CPU 50c reads out an instant voltage Ei applied from the voltage detection circuit 53, an instant current Ii applied from the current detection circuit 56 and an ambient temperature Tc detected by the temperature sensor 55 and determines as to whether or not the count value CNT is "0". In case the electric motor 32 is supplied with the drive current through power transistors Tr$_3$ to Tr$_5$, CPU 50c determines a "No" answer at step 208 and causes the program to proceed to step 210. At step 210, CPU 50c reads out an increment of temperature change $\Delta T$ from the memorized table of FIG. 5 on a basis of the detected values Ei·Ii and Tx−Tc. The table of FIG. 5 has been formed on a basis of the facts that the heating value of power transistors Tr$_3$ to Tr$_5$ increases in accordance with an increase of power consumption at transistors Tr$_3$ to Tr$_5$ and that the transistors Tr$_3$ to Tr$_5$ are conditioned to be quickly cooled when the temperature thereof becomes higher than an external temperature. As shown in the table of FIG. 5, the increment of temperature change $\Delta T$ increases in accordance with an increase of the value Ei·Ii indicative of the power consumption and decreases in accordance with an increase of the value Tx−Tc.

Figure 7:
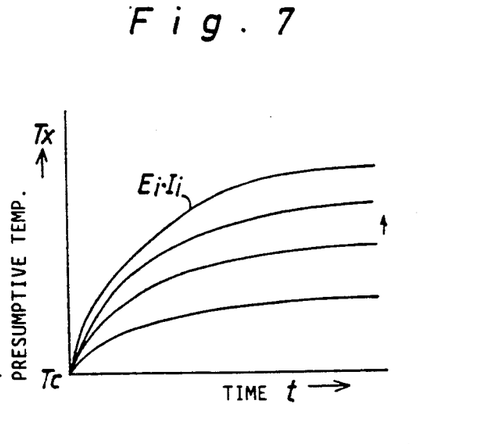
FIGS. 7, 8 and 9 are graphs illustrating a change of presumptive temperature of power transistors in relation to lapse of time.
Figure 9:
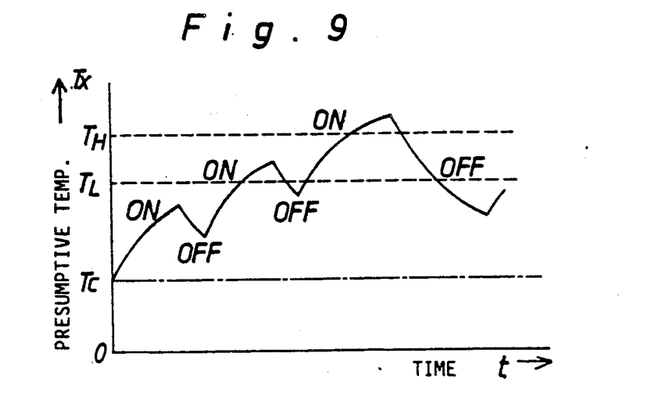

After processing at step 210, CPU 50c renews at step 212 the presumptive temperature Tx by addition of the increment of temperature change $\Delta T$. The processing at steps 210 and 212 will be repeated at each execution of the interruption program until the count value CNT becomes "0". Thus, the presumptive temperature Tx increases in accordance with lapse of time, as shown in FIG. 7. This serves to presume a temperature rise of power transistors Tr$_3$ to Tr$_5$ during supply of the power. If the presumptive temperature Tx becomes higher than an upper limit value T$_H$ as shown in FIG. 9, CPU 50c will determine a "Yes" answer at step 214 and set the enable flag ENB as "0" at step 216. When the presumptive temperature Tx is maintained below the upper limit value T$_H$, CPU 50c determines a "No" answer at step 214 so that the enable flag ENB is maintained as "1". In addition, the upper limit value T$_H$ is determined to represent a temperature at which the power transistors Tr$_3$ to Tr$_5$ are damaged by heating thereof.

Figure 6:
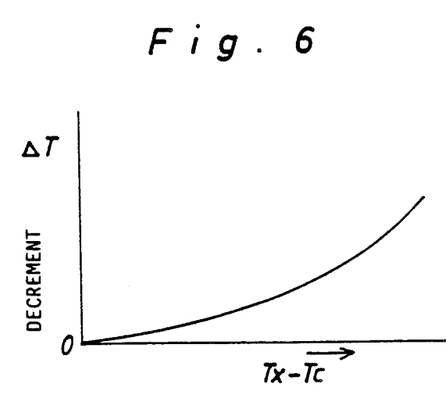
FIG. 6 is a graph illustrating a decrement of temperature change in relation to a difference between a presumptive temperature of power transistors and an ambient temperature.
Figure 8:
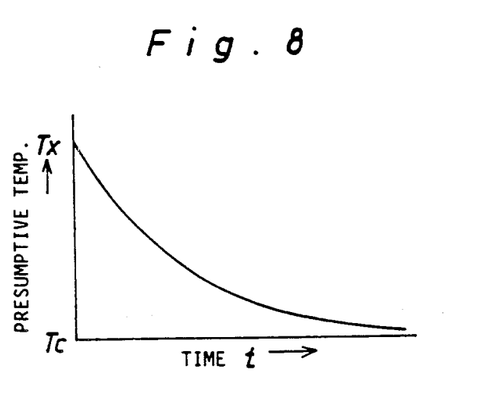

When the count value CNT is maintained as "0" during deenergization of the electric motor 32, CPU 50c determines a "Yes" answer at step 208 and causes the interruption program to proceed to step 218 where CPU 50c reads out a decrement of temperature change $\Delta T$ from the memorized table of FIG. 6 on a basis of the detected value Tx−Tc. The table of FIG. 6 has been formed on a basis of the fact that the power transistors Tr$_3$ to Tr$_5$ are conditioned to be quickly cooled when the temperature thereof becomes higher than the external temperature. As shown in FIG. 6, the decrement $\Delta T$ of temperature change is determined to be increased in accordance with an increase of the value Tx−Tc. After processing at step 218, CPU 50c renews at step 220 the presumptive temperature Tx by subtraction of the decrement $\Delta T$ therefrom. The processing at steps 218 and 220 will be repeated at each execution of the interruption program while the count value CNT is maintained as "0". Thus, the presumptive temperature Tx will decrease in accordance with lapse of time, as shown in FIG. 8. This serves to presume a temperature fall of power transistors Tr$_3$ to Tr$_5$ during supply of the power.

Since the temperature of transistors Tr$_3$ to Tr$_5$ does not fall below the ambient temperature Tc, CPU 50c will determine a "Yes" answer at step 222 if the presumptive temperature Tx becomes lower than the ambient temperature Tc and will set the presumptive temperature Tx as the ambient temperature Tc. When the presumptive temperature Tx decreases lower than a lower limit value T$_L$ as shown in FIG. 9, CPU 50c determines a "Yes" answer at step 226 and sets the enable flag ENB as "1". When the presumptive temperature Tx does not decrease lower than the lower limit value T$_L$, CPU 50c determines a "No" answer at step 226 so that the enable flag ENB is maintained as "0". From the above description, it will be understood that the enable flag ENB is changed to "0" from "1" when the presumptive temperature Tx increases higher than the upper limit value T$_H$. When the presumptive temperature Tx decreases lower than the lower limit value T$_L$, the enable flag ENB is changed to "1" from "0".

Assuming that the enable flag ENB is maintained as "1" when the main program has proceeded to step 114, CPU 50c determines a "Yes" answer to set the count value CNT as the positive value N at step 116. In turn, CPU 50c sets the event flag EVT as "0" and causes the program to proceed to steps 120 and 122. When the changeover switch 54 has been closed to engage the clutch mechanism 10, the count value CNT is set as the positive value N, and the new condition data HSW$_N$ is set as "1". Thus, CPU 50c determines a "No" answer at step 120 and a "Yes" answer at step 122 and causes the program to proceed to step 124. As a result, the electric motor 32 is activated to rotate in the forward direction until the count value becomes "0", and the clutch mechanism 10 is fully engaged during processing at step 124.

When the changeover switch 54 has been opened to disengage the clutch mechanism 10, the count value CNT is set as the positive value N and the new condition data HSW$_N$ is set as "0". Thus, CPU 50c determines a "No" answer at steps 120 and 122 respectively and causes the program to proceed to step 128. As a result, the electric motor 32 is activated to rotate in the reverse direction until the count value CNT becomes "0", and the clutch mechanism 10 is fully disengaged during processing at step 128. When the count value CNT becomes "0" by execution of the interruption program, CPU 50c determines a "Yes" answer at step 120 and causes the program to proceed to step 126. As a result, the electric motor 32 is deactivated by processing at step 126 in the same manner as described above.

Assuming that the enable flag ENB is maintained as "0" when the event flag EVT has been set as "1" by operation of the changeover switch 54, CPU 50c determines a "No" answer at step 114 and causes the program to proceed to step 120. In this instance, the count value CNT is maintained as "0". Thus, CPU 50c determines a "Yes" answer at step 120 and causes the program to proceed to step 126. As a result, the electric motor 32 is deactivated by processing at step 126. Subsequently, the execution at steps 104 to 108, 112, 114, 120 and 126 will be repeated since the event flag EVT is maintained as "1". In such a condition, the power transistors Tr$_3$ to Tr$_5$ are maintained in a deenergized condition, and the presumptive temperature Tx decreases during repetitive execution of the interruption program. When the enable flag ENB is changed to "1" from "0", CPU 50c determines a "Yes" answer at step 114 and executes processing at steps 116 to 128. Thus, the clutch mechanism 10 can be switched over in response to operation of the changeover switch 54. After the changeover switch 54 has been once operated, the electric motor 32 can be activated by execution of the main program.

As is understood from the above description, the applied voltage Ei, the supplied current Ii and the ambient temperature Tc are read out by CPU 50c during execution of the interruption program to presume the temperature of power transistors $Tr_3$ to $Tr_5$, and the power supply of the electric motor 32 through the power transistors $Tr_3$ to $Tr_5$ is controlled in accordance with change of the presumptive temperature Tx to protect the power transistors $Tr_3$ to $Tr_5$ from damage caused by overheating thereof.

What is claimed is:

1. A drive control apparatus for an electric actuator which is activated under control of a changeover switch, the drive control apparatus including a power transistor and an electric power source, said power transistor being arranged to supply therethrough electric power to said electric actuator from said electric power source in response to operation of said changeover switch, the drive control apparatus comprising:

means for detecting an ambient temperature of said power transistor, and for producing a temperature signal representing the detected ambient temperature;

means for detecting a consumption amount of the electric power during operation of said actuator, and for producing a power consumption signal representing the detected electric power consumption;

memory means, responsive to the produced temperature signal, for memorizing the detected ambient temperature at an initial stage of operation of the drive control apparatus as a presumptive temeprature representing an internal temperature of said power transistor;

renewal means, responsive to the produced temperature signal and the produced power consumption signal, for renewing the presumptive temperature by addition of an increment of temperature change defined in relation to a difference between the presumptive temperature and the ambient temperature in consideration with the consumption amount of the electric power when said actuator has been activated, and for renewing the presumptive temperature by subtraction of a decrement of temperature change defined in relation to a difference between the presumptive temperature and the ambient temperature caused by a lapse of time after said actuator has been deactivated; and means for permitting electric power to be supplied to said actuator through said power transistor when the renewed presumptive temperature is lower than a predetermined value, and for prohibiting electric power from being supplied to said actuator through said power transistor when the presumptive temperature is higher than the predetermined value.

2. The drive control apparatus as claimed in claim 1, wherein said means for detecting a consumption amount of the electric power includes a voltage detection circuit for detecting a voltage applied to said actuator across said power transistor, and a current detection circuit for detecting a drive current supplied to said actuator through said power transistor.

* * * * *